United States Patent [19]
Penelon et al.

[11] Patent Number: 6,023,555
[45] Date of Patent: Feb. 8, 2000

[54] RADIANT HEATING APPARATUS AND METHOD

[75] Inventors: Joel Penelon, Monrovia; Andre Cardoso, Laurel, both of Md.

[73] Assignee: Eaton Corporation, Cleveland, Ohio

[21] Appl. No.: 09/134,865

[22] Filed: Aug. 17, 1998

[51] Int. Cl.[7] .................................................. H01L 21/205
[52] U.S. Cl. ..................... 392/416; 392/421; 118/724; 219/405
[58] Field of Search .................... 392/416, 418, 392/421, 423, 424; 219/390, 405, 411; 118/725, 50.1, 724; 266/87

[56] References Cited

U.S. PATENT DOCUMENTS

| | | | |
|---|---|---|---|
| 4,891,499 | 1/1990 | Moslehi | 219/354 |
| 5,155,336 | 10/1992 | Gronet et al. | 219/411 |
| 5,158,644 | 10/1992 | Cheung et al. | 156/643 |
| 5,179,677 | 1/1993 | Anderson | 392/411 |
| 5,418,885 | 5/1995 | Hauser | 392/416 |
| 5,485,985 | 1/1996 | Eppeland | 266/87 |
| 5,504,831 | 4/1996 | Sandhu | 392/418 |
| 5,561,612 | 10/1996 | Thakur | 364/557 |
| 5,740,314 | 4/1998 | Grimm | 392/420 |

*Primary Examiner*—John A. Jeffery
*Attorney, Agent, or Firm*—Pollock, Vande Sande & Amernick, R.L.L.P.

[57] ABSTRACT

A radiant heating apparatus for reducing the cumulative temperature gradient over a semiconductor workpiece during a low temperature process is comprised of a plurality of reflecting units, wherein each reflecting unit is comprised of a back reflector, a tubular reflector extending from the back reflector towards the workpiece, and a radiant energy source disposed in the tubular reflector in front of the back reflector, wherein a cross section of the tubular reflector is in the shape of a truncated segment of a circle.

22 Claims, 4 Drawing Sheets

RADIANT HEATING APPARATUS AND METHOD

FIELD OF INVENTION

The present invention is directed to a radiant heating apparatus and method, for use with semiconductor manufacturing equipment.

BACKGROUND OF THE INVENTION

It is known that many processes performed during the manufacture of a semiconductor device require heating of the workpiece. It is most desirable that this heating be uniform across the surface of the workpiece since this will tend to result in a uniform process being performed.

In the prior art, different heating configurations have been proposed to attain relative temperature uniformity. During a typical process, there is a temperature ramping phase where the temperature of the wafer is brought up rapidly to a predetermined level, and a steady state phase where the temperature is maintained at about this level. The temperature non-uniformity has tended to be greater during the ramping phase.

One approach to attaining a uniform temperature is called "zone control". In zone control, a plurality of radiant heating units such as infrared lamps are divided into zones and the lamps in a given zone receive the same power, while lamps in different zones may receive different power, to result in uniform temperature across the wafer. While zone control is advantageous in some applications, it requires complex electronic controls of the power applied to the lamps.

A high temperature, rapid thermal process using flood heating is known. With flood heating, a temperature inversion may be observed wherein the edge of the workpiece is hotter during the ramping phase, while the center of the wafer is hotter during the steady state phase. It has been recognized that this is undesirable in the high temperature environment (e.g. 1150° C.) of rapid thermal processing because the edge to center temperature differences at such process temperature create stresses which can damage the workpiece.

SUMMARY OF THE INVENTION

It is thus an object of the present invention to provide a radiant heating apparatus and method for semiconductor processing which are simple and reliable.

It is a further object of the invention to provide such a system and method which reduce the center to edge cumulative temperature gradient, resulting in more uniform processing of a workpiece.

The inventors have discovered that as applied to a low temperature process (wherein the wafer temperature is kept below about 400° C.), the above-discussed temperature inversion effect is highly desirable because it tends to reduce the center to edge cumulative temperature gradient as the process is performed. Since in the first part of the process (ramping phase), the edge of the workpiece is hotter than the center, while in the second part (steady state phase) the center is hotter than the edge, the area under the center to edge temperature gradient curve (cumulative temperature gradient) is first negative and then positive, with the total area being smaller than if the gradient were only in one direction, resulting in a more uniform process. Furthermore, the temperature stresses created by such inversion within appropriate limits do not damage the wafer in a low temperature process. This uniform process is then achieved without using an expensive and complex system such as zone control.

In accordance with a first aspect of the present invention, a radiant heating apparatus for reducing the cumulative temperature gradient over a semiconductor workpiece during a low temperature process is provided which comprises a plurality of lamps which emit radiant heat energy, and a plurality of lamp reflectors, one associated with each lamp, for directing radiant heat energy to a region that the workpiece will occupy, configured so that when said workpiece is present, its temperature will be less than about 400° C., and the edge region will be hotter than the center when the heat emitted by the lamps is relatively high during a temperature ramping phase, but will be cooler than the center when the heat emitted by the lamps is lower during a temperature steady state phase.

In accordance with a second aspect of the invention, a radiant heating apparatus is provided including a plurality of reflecting units, wherein each reflecting unit comprises a back reflector, a tubular reflector extending from said back reflector towards the workpiece region, and a radiant energy source disposed in said tubular reflector in front of the back reflector, wherein a cross section of the tubular reflector is in the shape of a truncated segment of a circle.

In accordance with a third aspect of the invention, reflecting units are provided having a diffuse back reflector and a specular tubular reflector.

In accordance with a fourth aspect of the invention, a reflecting structure for retrofitting a pre-existing array of ellipsoidal reflectors is provided.

The invention will be better described by referring to the accompanying drawings, wherein:

DETAILED DESCRIPTION OF PREFERRED EMBODIMENTS

Figure 1:
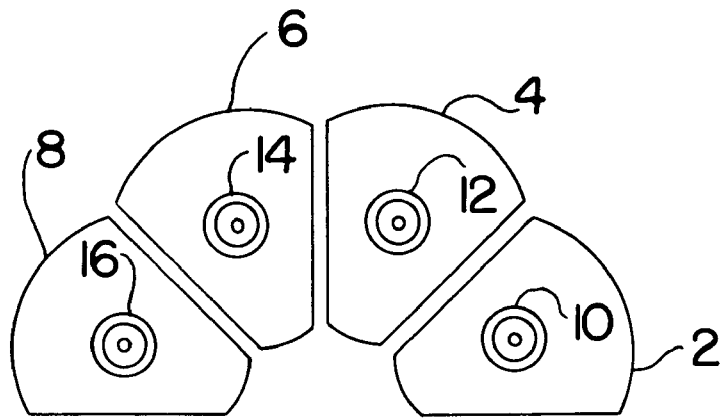
FIGS. 1 and 2 show a prior art reflector array for use in radiant heating of a semiconductor workpiece.
Figure 2:
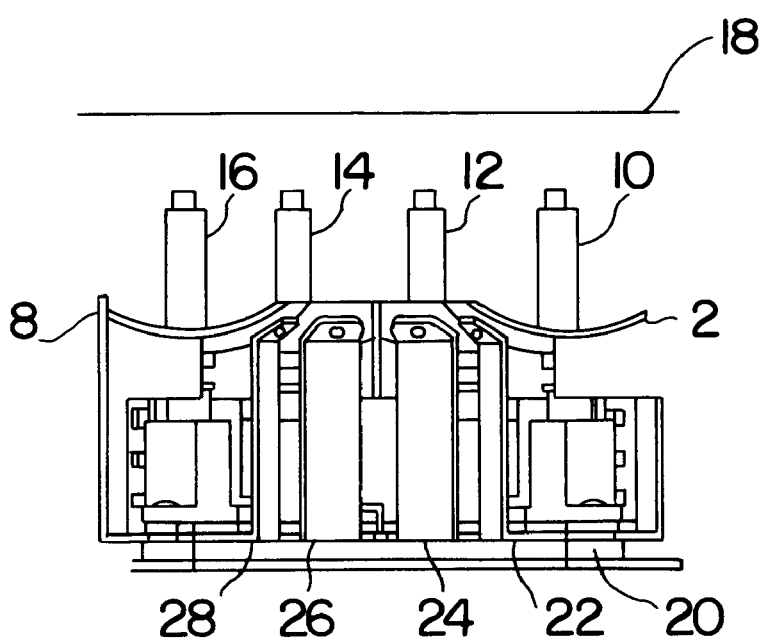

FIGS. 1 and 2 depict a prior art radiant heating reflector array for use with semiconductor process chambers. In FIG. 1, which is a plan view, four ellipsoidal reflectors 2, 4, 6, and 8 are shown (half the entire 360° ring array), wherein the reflectors are associated with respective lamps 10, 12, 14, and 16.

The lamps are infrared producing, such as quartz halogen type, and referring to FIG. 2, which is a side view, the reflectors are seen concentrating heat energy on a semiconductor workpiece, wafer 18. A support structure for the reflectors is also shown comprised of base 20 and strut members 22, 24, 26, and 28.

The reflecting units are positioned so as to irradiate a region near the edge of the wafer. This is because the center, by virtue of its geometric location, would get hotter than the edge if irradiation were uniform across the wafer.

As discussed, above, it is desirable for the temperature of the wafer to remain substantially uniform across its surface area during processing so as to promote the performance of a uniform process. The process may be any of the many processes performed on semiconductor wafers including but not limited to, ashing, etching, and residue removal. The invention is concerned with low temperature processes, i.e., those during which the wafer remains below about 400° C., and the graph in FIG. 3 depicts the center to edge temperature gradient for a 270° C. process.

Figure 3:
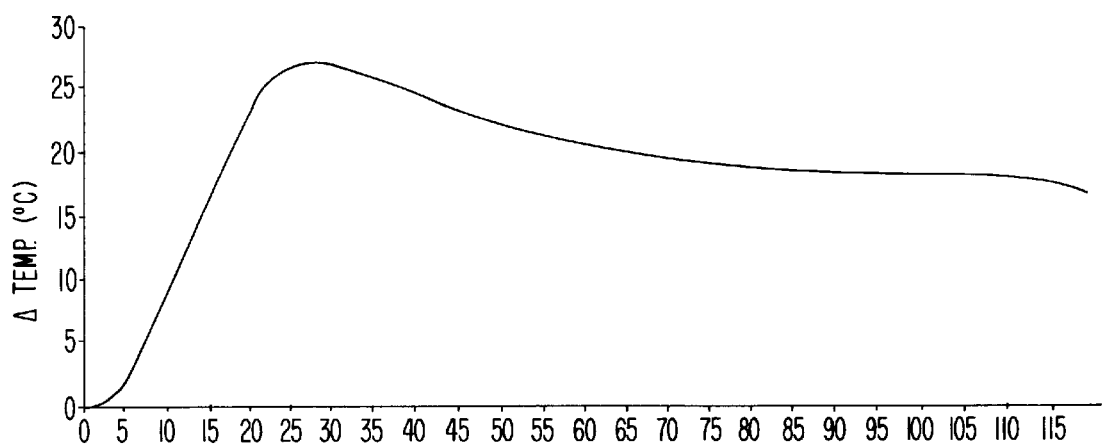
FIG. 3 is a graph of the center to edge temperature gradient using the reflector array of FIGS. 1 and 2 for a low temperature process.

As will be noted by referring to FIG. 3, the process is divided into a temperature ramping phase and a temperature steady state phase. During the ramping phase, the power applied to the lamp filament is higher than in the steady state phase, so as to cause the wafer temperature to ramp up to the appropriate temperature. Upon reaching this temperature, the power is reduced and the steady state phase ensues. The temperature is generally more non-uniform during the ramping phase than during the steady state phase.

Referring to FIG. 3, it will be observed that in the particular example given, the ramping phase lasts about 25 seconds, and the maximum temperature gradient exceeds about 26° C. During the steady state phase the temperature gradient is about 20° C.

Figure 4:
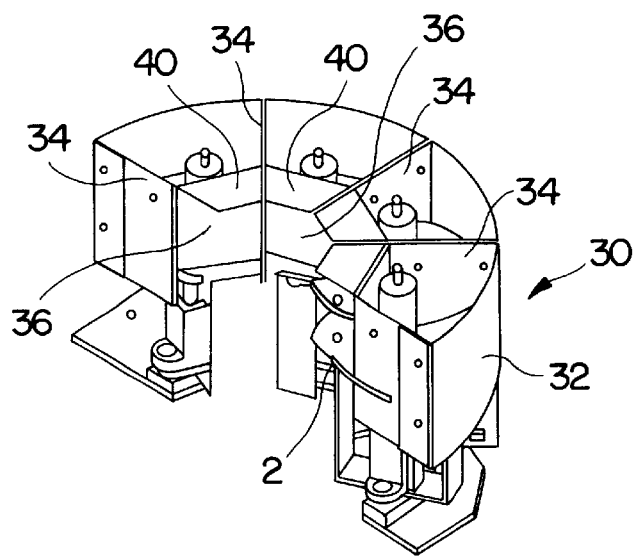
FIG. 4 is a perspective view of an embodiment of the invention.

Referring to FIG. 4, an embodiment of the invention is depicted. In the embodiment illustrated, a reflecting structure 30 is added to the prior art array shown in FIGS. 1 and 2. Reflecting structure 30 is configured so as to result in a temperature inversion effect at the wafer, that is during the ramping phase, the edge of the wafer is hotter than the center, while during the steady state phase, the reverse is true. Since the center to edge temperature gradient is first negative and then positive, the cumulative temperature gradient, indicative of how uniform the temperature is as a function of elapsed time is reduced, resulting in a more uniform process.

Figure 5:
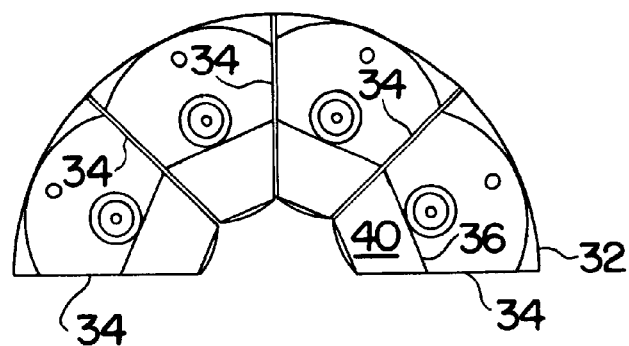
FIG. 5 is a plan view of the embodiment shown in FIG. 4.
Figure 6:
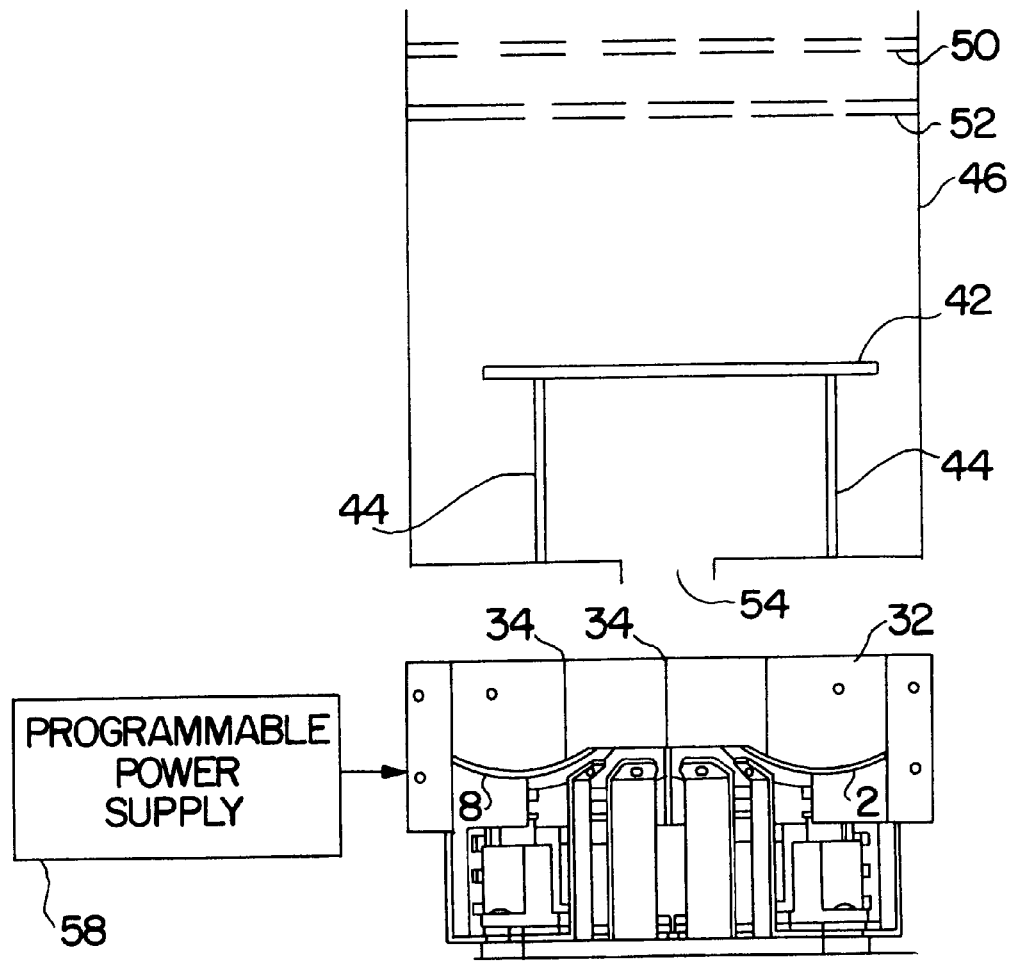
FIG. 6 shows a side view of the embodiment shown in FIG. 4 with a process chamber.

Referring again to FIG. 4, and also to the plan view of FIG. 5 as well as the side view of FIG. 6, it is seen that reflector structure 30 is comprised of cylindrical band 32, radially extending partitions 34, and flat inner members 36. These are bonded together so as to form reflecting units, each of which is comprised of a back reflector (ellipsoidal members) and a tubular reflector which is comprised of a portion of cylindrical band 32, two adjacent partitions 34, and flat inner member 36. A cross-section of the tubular reflector is in the shape of a truncated segment of a circle. The inner surfaces of the tubular reflector are specular, as by being made of aluminum or Alzak and/or having a polished finish applied. On the other hand, the finish of the back reflector is diffuse. It should be appreciated that while only half of a ring of lamps is shown, for ease of illustration, in an actual embodiment a full ring would be used.

When a specular ellipsoidal reflector is used as in the prior art, the focussing effect of the reflector and thus the temperature uniformity is diminished when the lamp filament warps, as it heats during use. Rendering the elliptical member to be diffuse (as by roughening its surface) is a solution to this problem, since it is no longer sharply focussed.

Referring to FIG. 6, the radiant heating apparatus is shown being used to heat semiconductor wafer 42, which is disposed on support structure 44 in process chamber 46. When process chamber 46 is used for afterglow plasma ashing, plasma species are fed in through the top, and mesh structure 50, 52 is effective to uniformly disperse it on wafer 42 to effect ashing, the waste products being drawn down by a vacuum applied to bottom opening 54. A vacuum line (not shown) may pass through the center opening in the reflector structure. A programmable power supply 58 feeds power to the lamps. Such apparatus is well known to those skilled in the art, and is comprised of a power supply which can be programmed to supply different power levels for selected periods of time. In the present case, the power supply is arranged so as to provide a relatively higher power during the ramping phase and a lower power during the steady state phase.

Referring to FIG. 4, it is seen that the reflecting partitions 34 and the flat inner members 36 are close to the lamps, thus preventing heat from the lamps from being directed to the center of the wafer. Also, the cross sectional area of the tubular reflectors is non-circular, so that the lengthwise multiple reflections result in more uniform radiation at the wafer. It is noted that the radiation is emitted mostly perpendicular to the long direction of the lamp filaments to the walls of the tubular reflector, where after multiple reflections it exits at the top of the tubular reflector. According to the laws of optics, the irregular (non-circular) cross sectional shape of the tubular reflectors results in more uniform radiation at the exit end.

Figure 7:
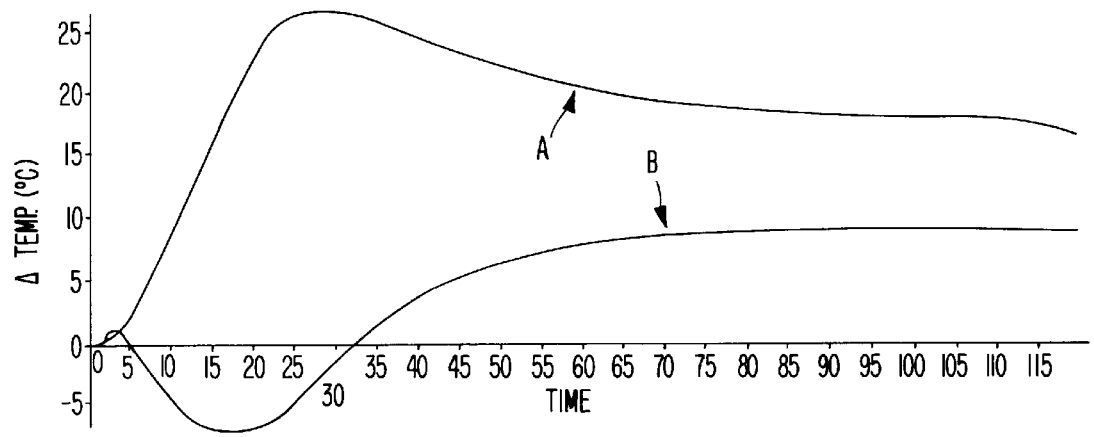
FIG. 7 is a graph of the comparison of the center to edge temperature gradient obtained with the apparatus of the invention and with the prior art reflector array.
Figure 8:
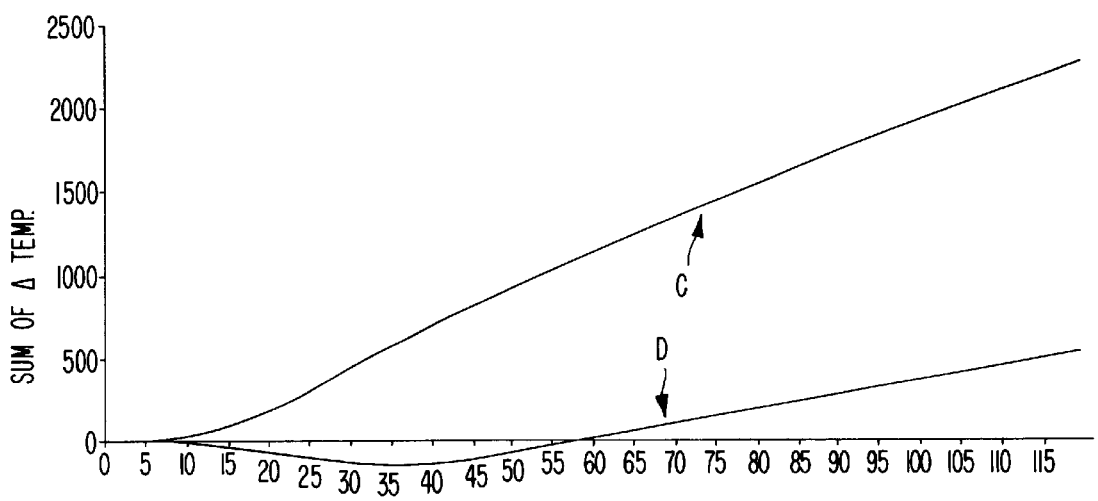
FIG. 8 is a comparison of the cumulative center to edge temperature gradient obtained with the apparatus of the invention and with the prior art reflector array.

The improved results obtained with the invention are shown in FIGS. 7 and 8. FIG. 7 is a comparison of the center to edge temperature gradient obtained with the prior art arrangement and with the invention. For a low temperature process at 270° C., curve A depicts the temperature gradient with the prior art arrangement using ellipsoidal reflectors. Curve B depicts the gradient utilizing the embodiment of the invention depicted in FIGS. 4 to 6. It is seen that a temperature inversion effect is produced, wherein the edge is hotter than the center during the ramping phase while the center is hotter than the edge during the steady state phase. Referring to curve B, it is seen that with the invention, after fast ramping, the gradient slowly resumes the center to edge orientation, but due to the inversion, it keeps low absolute values.

As noted above, ashing and etching processes are, among other factors, proportional to the temperature. So, the difference of ashing/etching from center to edge is a function of the integral of the center to edge temperature gradient during the process time.

FIG. 8 shows the cumulative values of the temperature gradient for the prior art and the invention. Using the prior art array, it is noted that integral always increases, causing the process to be always non-uniform. However, in the case of the invention, due to the initial gradient inversion, the process non-uniformity is minimized. Furthermore, as shown in FIG. 8, one minute processes are optimized wherein the cumulative temperature gradient is zeroed.

The reason that the reflecting structure of the invention causes the temperature inversion to take place is that the structure redirects the radiant energy from the center of the workpiece as in the prior art, to the edge. In the ramping phase, when the power applied to the lamps is high, the dominant heating mechanism is the radiant energy from the lamps which causes the workpiece to be heated from the edge to the center, thus causing the former to be hotter than the latter. In the steady state phase, when the radiant heat is lower, this edge to center heating is no longer the dominant heating mechanism. Instead, the heat conduction inside the workpiece, the wall effect, the contribution of the chamber and the ashing/etching process, all cause the gradient temperature to be outward.

In one implementation of the invention, the ellipsoidal reflector array of the prior art is retrofitted with the reflecting structure 30. Such structure is merely set over the pre-existing array, with partitions 34 being press-fit in the spaces between adjacent reflectors, while bottoms of the partitions rest on the back reflectors. Inner members 36 are bent over at the top to provide reflecting plates 40, which may promote reflection efficiency. In other implementations of the invention, an entire structure may be provided as a new piece of equipment. In such implementations, the back reflectors need not be ellipsoidal.

It is noted that while the invention has been illustrated in connection with illustrative embodiments, variations which fall within the teachings of the invention will occur to those skilled in the art. Hence, the scope of the invention is to be defined only by the claims which are appended hereto and equivalents.

What is claimed:

1. A radiant heating apparatus for reducing the cumulative temperature gradient over a semiconductor workpiece during a low temperature process, comprising,
   a plurality of lamps which emit radiant heat energy, and
   a plurality of lamp reflectors, one associated with each lamp, for directing said radiant heat energy to a region that said workpiece will occupy, configured so that when said workpiece is present its temperature will be less than about 400° C., and the edge region will be hotter than the center when the heat emitted by the lamps is relatively high during a temperature ramping phase, but will be cooler than the center when the heat emitted by said lamps is lower during a temperature steady state phase, resulting in lower absolute values of temperature gradient over the semiconductor workpiece than if the temperature of the edge was either hotter or cooler than the center during both the temperature ramping and steady state phases.

2. The apparatus of claim 1 wherein each lamp reflector comprises,
   a back reflector, and
   a tubular reflector extending from said back reflector towards the region that said workpiece will occupy.

3. The apparatus of claim 2 wherein the lamp reflectors are arranged in a ring.

4. The apparatus of claim 3 wherein a cross section of said tubular reflector is non-circular.

5. The apparatus of claim 4 wherein a cross section of said tubular reflector is in the shape of a truncated segment of a circle.

6. The apparatus of claim 5 wherein said back reflector has an ellipsoidal shape.

7. The apparatus of claim 5 wherein said back reflector is diffuse.

8. The apparatus of claim 7 wherein said tubular reflector is specular.

9. The apparatus of claim 5 wherein said reflecting units are contiguous.

10. The apparatus of claim 2 wherein said back reflector is diffuse.

11. The apparatus of claim 10 wherein said reflecting units are contiguous.

12. An apparatus for reducing the cumulative temperature gradient over a semiconductor wafer to be heated with radiant heat energy during a low temperature process, comprising,
   first means for applying radiant heat energy to a semiconductor wafer in a temperature ramping phase such that the temperature of the wafer remains lower than about 400° C. and the edge region of the wafer is hotter than the center, and
   second means for applying said radiant heat energy to said wafer, after said temperature ramping phase is finished, in a temperature steady state phase such that the temperature of the wafer remains lower than about 400° C. and the center of the wafer is hotter than the edge region, resulting in lower absolute values of temperature gradient over the semiconductor wafer than if the temperature of the edge was either hotter or cooler than the center during both the temperature ramping and steady state phases.

13. The apparatus of claim 12 wherein said radiant heat energy is generated by radiant energy heating units and wherein said second means for applying said radiant heat energy includes means for lowering the heat generated by said heating units to a level which is below a heat level which is attained in said ramping phase.

14. The apparatus of claim 13 wherein each of said first and second means for applying said radiant heat energy includes a ring of reflecting units, wherein each reflecting unit is comprised of an ellipsoidally shaped back reflector and a tubular reflector extending from said back reflector, which tubular reflector has a cross section in the shape of a truncated segment of a circle.

15. The apparatus of claim 14 wherein said back reflector is diffuse and said tubular reflector is specular.

16. An apparatus for directing radiant energy towards a workpiece region which a semiconductor workpiece being processed will occupy, comprising,
   a process chamber including means for supporting a semiconductor workpiece at said workpiece region, and
   a plurality of radiant energy reflecting units for directing radiant energy towards said workpiece region, each said reflecting unit comprising,
      a back reflector,
      a tubular reflector extending from said back reflector towards said workpiece region, and
      a radiant energy source disposed in said tubular reflector in front of said back reflector, wherein a cross section of said tubular reflector is in the shape of a truncated segment of a circle and said workpiece region is displaced from said tubular reflector in a direction away from said back reflector.

17. The apparatus of claim 16 wherein said back reflector has an ellipsoidal shape.

18. The apparatus of claim 17 wherein said back reflector is diffuse and said tubular reflector is specular.

19. The apparatus of claim 18 wherein said reflectors are arranged in a ring.

20. In a radiant heating apparatus for semiconductor processing, a reflector structure for retrofitting an array of ellipsoidal reflectors arranged in a ring, comprising,
   a cylindrical band having a polished finish at least on the inside,
   a plurality of radially extending partitions having a polished finish extending inwardly from said cylindrical band, the outer edges of said partitions abutting said cylindrical band, the edges of said partitions opposite to said outer edges being inner edges, and
   a plurality of flat plates having a polished finish at least on the side facing said cylindrical band connecting said partitions at their inner edges.

21. A method of reducing the cumulative temperature gradient over a semiconductor wafer being heated with radiant energy during a low temperature process, comprising the steps of, applying said radiant energy during a temperature ramping phase such that the outside region of the wafer is hotter than the center, and after said temperature ramping phase is finished, applying said radiant energy during a temperature steady state phase such that the center of the wafer is hotter than the outside region, wherein the temperature of the wafer is below about 400° C. during both the ramping and steady state phases, resulting in lower absolute values of temperature gradient over the semiconductor wafer than if the temperature of the edge was either hotter or cooler than the center during both the temperature ramping and steady state phases.

22. The method of claim 21 wherein said cumulative temperature gradient is zero at a predetermined time during said process.

* * * * *